(12) United States Patent
Shigeno

(10) Patent No.: US 7,042,149 B2
(45) Date of Patent: May 9, 2006

(54) CIRCUIT ARRAY SUBSTRATE FOR DISPLAY DEVICE

(75) Inventor: Hirotaka Shigeno, Hyogo-ken (JP)

(73) Assignee: TFPD Corporation, Himeji (JP)

( * ) Notice: Subject to any disclaimer, the term of this patent is extended or adjusted under 35 U.S.C. 154(b) by 259 days.

(21) Appl. No.: 10/456,584

(22) Filed: Jun. 9, 2003

(65) Prior Publication Data

US 2004/0008167 A1    Jan. 15, 2004

(30) Foreign Application Priority Data

Jun. 13, 2002  (JP)  .............................. 2002-173338

(51) Int. Cl.
*H01J 1/62*  (2006.01)

(52) U.S. Cl. ...................................... 313/498; 257/686

(58) Field of Classification Search ................ 257/686, 257/732, 777; 313/498
See application file for complete search history.

*Primary Examiner*—Joseph Williams
(74) *Attorney, Agent, or Firm*—Oblon, Spivak, McClelland, Maier & Neustadt, P.C.

(57) ABSTRACT

A circuit array substrate 10 includes pixel and connecting edge sections 80 and 90. Connecting edge section 90 is provided with edge portions 5a and shoulder portions 55 of transparent thin resin film 5 over which terminal pins 101 of tape carrier packages (TCP) 100 are disposed. Terminal pins 101 are connected to connecting pads 14 at their contact portions 103. Shoulder portions 55 prevent a coated photoresist film from being excessive in depth and residues of the photoresist film from being left in the foot of edge face 5a in the step of forming metal reflective pixel electrodes. Thus, no residue of the metal film exists after its etching treatment in that step so that no electrical short circuits are caused between connecting pads 14 and adjacent terminal pins 101.

2 Claims, 12 Drawing Sheets

CIRCUIT ARRAY SUBSTRATE FOR DISPLAY DEVICE

FIELD OF THE INVENTION

This invention relates to a circuit array substrate for a display device, such as a liquid crystal display device, and a method of manufacturing the same.

CROSS-REFERENCE TO RELATED APPLICATION

This application is based upon and claims the benefit of priority from the prior Japanese Patent Application No.2002-173338, filed on Jun. 13, 2002; the entire contents of which are incorporated herein by reference.

BACKGROUND OF THE INVENTION

Recently, various display devices have been actively developed as replacements for cathode ray tube display devices. Since compared with others liquid crystal display (LCD) devices are light in weight, thin in thickness and low in power consumption, they are widely used in many applications. Active matrix type liquid crystal display (AMLCD) devices are particularly main-stream products in such LCD devices because pixels of the AMLCD devices each include switching elements to separate electrically enabled pixels from disabled ones, the enabled pixels hold video signal supplied to them. It is because no cross-talk takes place between adjacent pixels and the AMLCD devices display good quality images. A transparent type AMLCD device provided with thin film transistors as switching elements will be explained by way of example. The AMLCD device includes a liquid crystal layer held between circuit array and counter substrates through alignment films attached to their inside surfaces. The circuit array substrate includes a transparent substrate made of glass or quartz, signal and scanning lines disposed in a matrix on the substrate, an insulation film to isolate the signal lines from the scanning lines, and transparent pixel electrodes made of indium-tin-oxide (ITO) films provided at elements of the matrix. Thin film transistors each are disposed as switching elements to control the pixels at vicinities of intersecting points in the matrix. Gate and drain electrodes of the transistors are connected to the scanning and signal lines, respectively, while source electrodes are connected to the pixel electrodes.

The counter substrate includes an ITO counter electrode formed over the transparent substrate and a color filter layer for color image displays. The circuit array substrate extends a shelf-like portion used for a connecting edge section to the outside of a sealing area of the LCD device. The shelf-like portion is provided with connecting pads to which input terminals for outer drive circuits are connected. The connecting pads are made of extending portions of the scanning and signal lines. The liquid crystal layer held between the circuit array and counter substrates is sealed by a sealant at their frame edges.

Recently, in order to expend the formation area of pixel electrodes, the pixel electrodes are arranged on a thick insulation resin film to insulate the pixel electrodes from signal or scanning lines and surroundings of the pixel electrodes are overlapped with these lines. The thickness of such an insulation resin film is generally 1 μm to 10 μm and, preferably, 2 μm to 4 μm. Further, the insulation resin film is a low dielectric constant organic resin so that the pixel electrodes and the signal and scanning lines overlapped with them through the insulation resin film form small electric capacitances and electric short circuits between them occur only as a remote possibility.

Usually, the circuit array substrate in these display devices requires naked sections where such a thick insulation resin film is removed to expose the connecting pads provided at the connecting edge section of the circuit array substrate. The connecting pads extending from the signal and scanning lines are connected to output terminals of a tape carrier package (TCP). The output terminals of the TCP are pin-like ones provided for a high resolution display and easy assembling and their hooks or thicker edge portions, for example, are engaged with the connecting pads. When the AMLCD device is assembled with the TCP, however, electric short circuits occur between adjacent terminal pins of the TCP at times. Carefully analyzing possible causes for the electric short circuits, the inventor has discovered that electrically conductive layers of the pixel electrodes remain strip-like at outer portions of the connecting pads without etching.

SUMMARY OF THE INVENTION

It is, accordingly, an object of the present invention to provide a circuit array substrate of a display device with prevention of electric short circuits between adjoining connecting pads and a method of manufacturing the same.

According to the present invention, a circuit array substrate for a display device includes an insulation substrate, a wiring pattern formed on the insulation substrate, connecting pads connected to the wiring pattern, a more than 1 μm thick insulation film to coat the wiring pattern except the connecting pad where a naked portion is defined, and electrically conductive pixel electrodes formed on the thick insulation film, wherein the thick insulation film includes edge portions and shoulder portions provided close to the connecting pad where a naked portion is defined.

The circuit array substrate for a display device is characterized in that the edge portions of the thick insulation film are provided with rectangular projections extending to the shoulder portions in a direction of the connecting pad and pitches of the rectangular projections are substantially the same as those of the connecting pads.

A method of manufacturing a circuit array substrate for a display device includes the steps of preparing an insulation substrate, forming a wiring pattern on the insulation substrate and connecting pads connected to the wiring pattern, and forming a more than 1 μm thick insulation film except for the connecting pads where naked sections are made by treatments of coating a photoresist, exposure and development, and forming electrically conductive pixel electrodes on a thick resin film, wherein the step of forming the thick insulation film uses a photomask with light blocking portions, full exposure portions to form the naked sections, and intermediate exposure portions to form shoulder portions.

The method of manufacturing a circuit array substrate for a display device is characterized in that the electrically conductive pixel electrodes include metal reflective pixel electrodes and the intermediate exposure portions are further used to form uneven patterns corresponding to the metal reflective pixel electrodes.

The method of manufacturing a circuit array substrate for a display device is further characterized in that the intermediate exposure portion includes first semi-transparent members for the uneven patterns and second ones for the shoulder portions that are different in transparency from the first semi-transparent members thereby to make the uneven pattern one half in depth of the shoulder portion or less.

The method of manufacturing a circuit array substrate for a display device is additionally characterized in that the intermediate exposure portion includes first apertures for the uneven patterns and second ones for the shoulders that are different in diameter from the first apertures thereby to make the uneven pattern one half in depth of the shoulder portions or less.

BRIEF DESCRIPTION OF THE DRAWINGS

A more complete appreciation of the present invention and many of the attendant advantages thereof will be readily obtained as the same becomes better understood by reference to the following detailed descriptions when considered in connection with the accompanying drawings, wherein.

DETAILED EXPLANATION OF THE PREFERRED EMBODIMENTS

A circuit array substrate for an LCD device of an embodiment according to the present invention will be explained below with reference to attached drawings.

Figure 1:
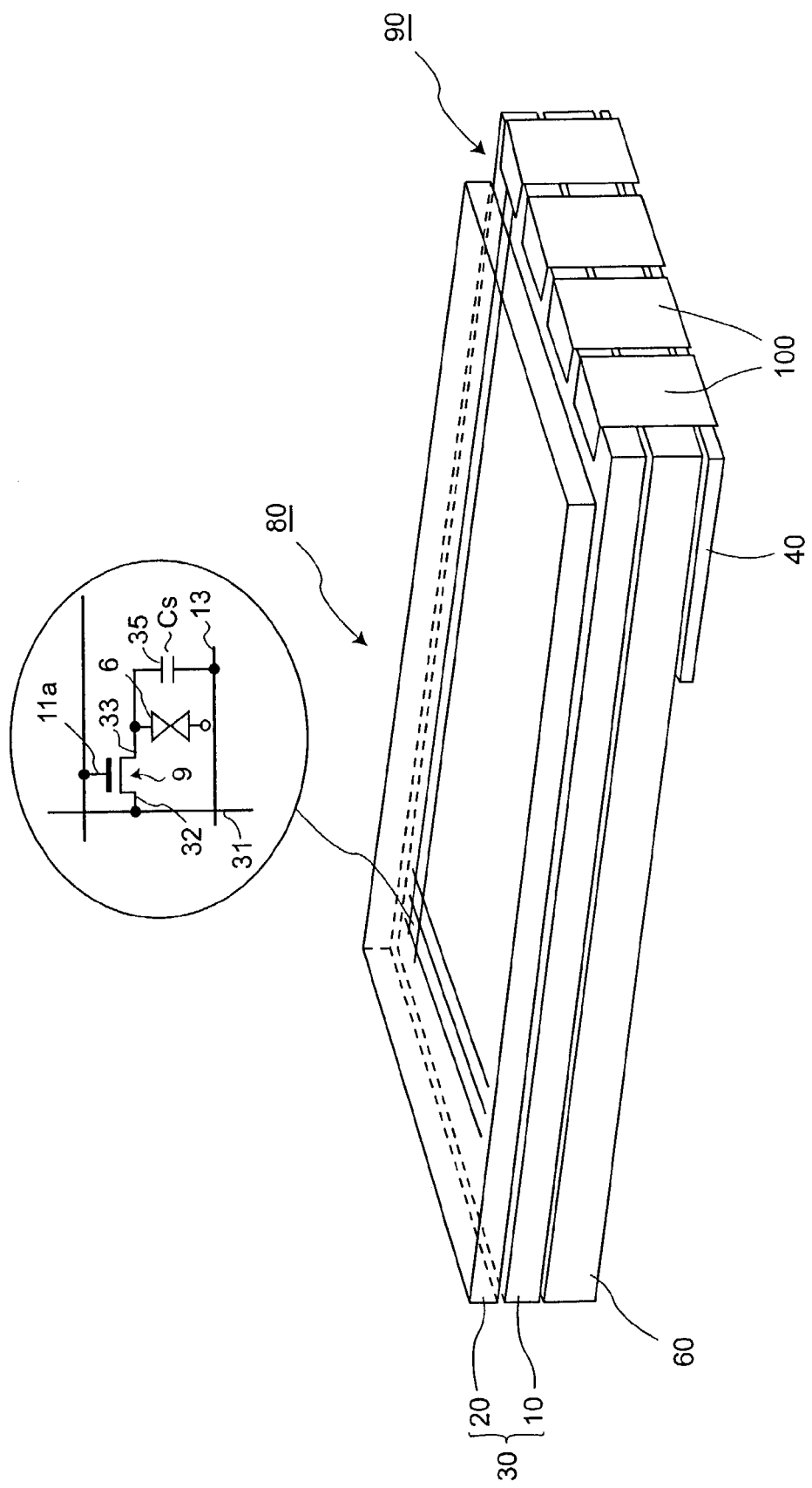
FIG. 1 is a perspective view of an LCD device with an equivalent circuit of its pixel.
Figure 2:
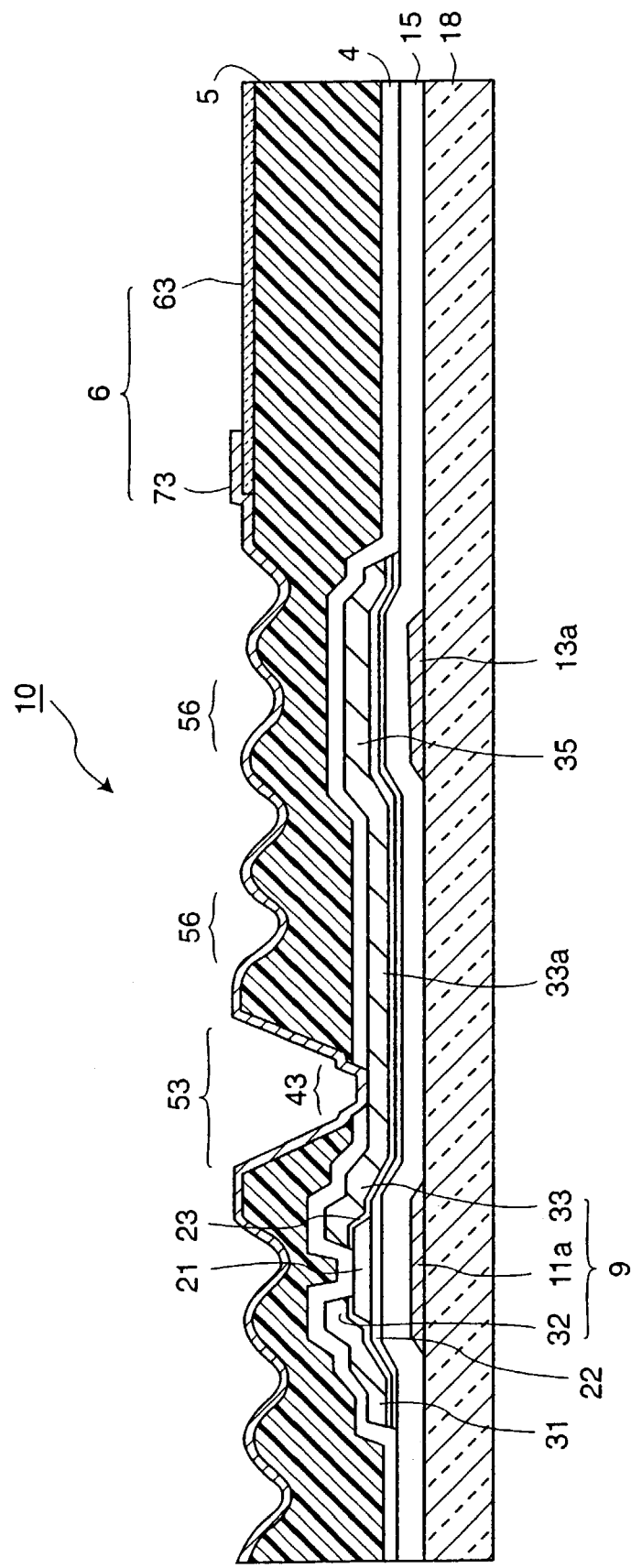
FIG. 2 is a sectional view of a pixel section of a circuit array substrate in accordance with an embodiment of the present invention.
Figure 3:
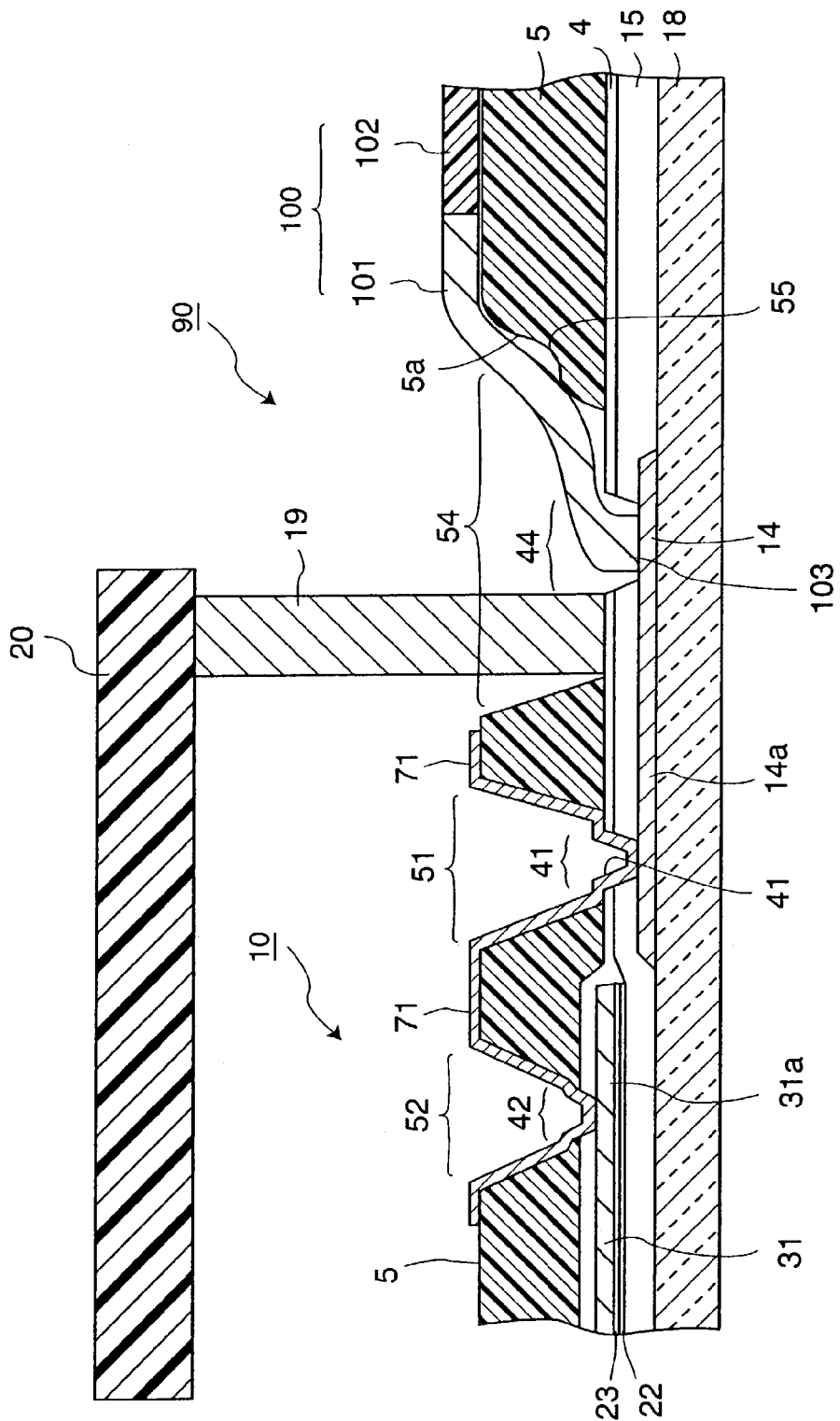
FIG. 3 is a sectional view of a connecting edge section of the circuit array substrate in accordance with the embodiment of the present invention.
Figure 4:
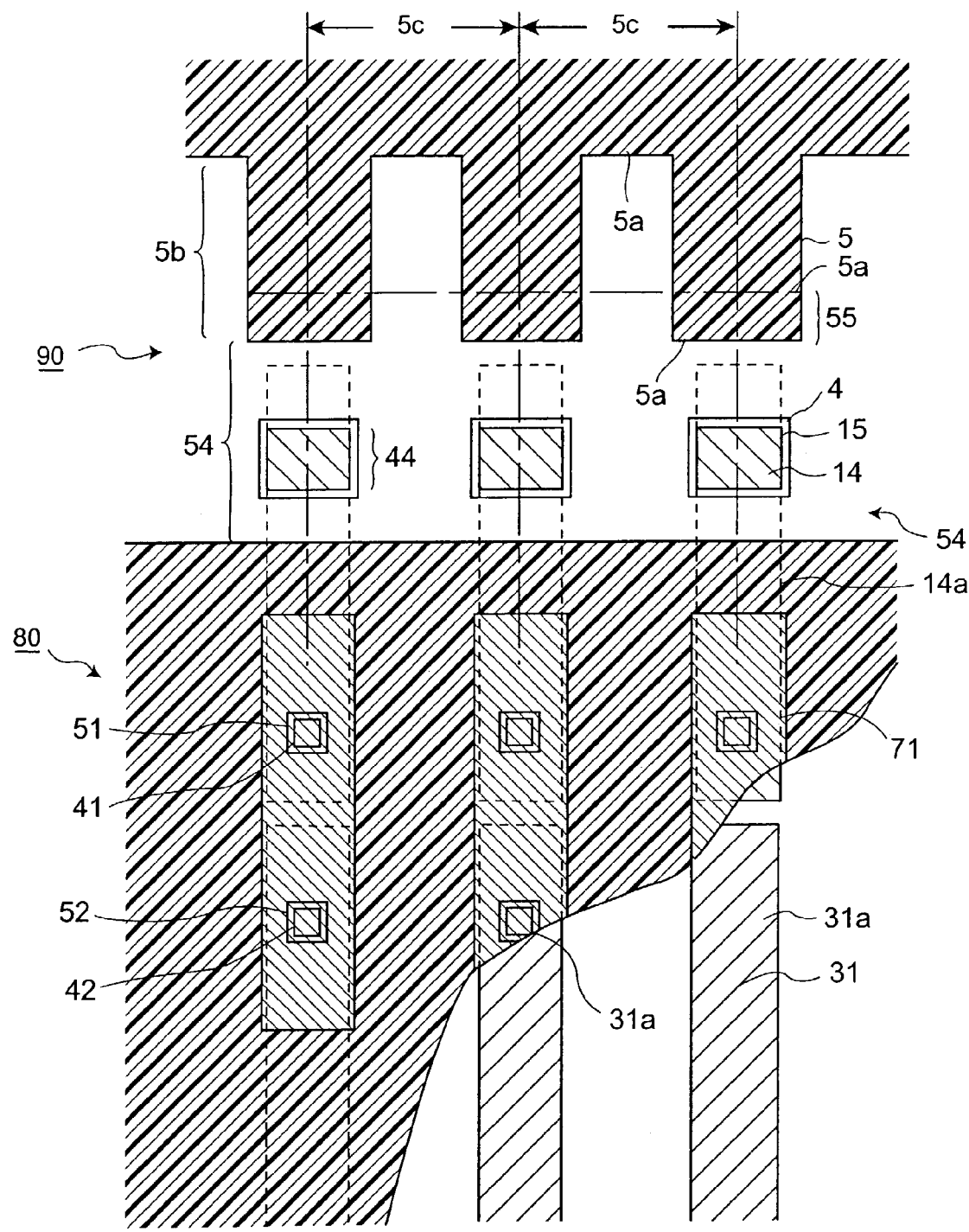
FIG. 4 is a plan view of a layout of the connecting edge section in the circuit array substrate shown in FIG. 3.

FIG. 1 shows schematically a perspective view of the LCD device with an equivalent circuit of its pixel. FIG. 2 is a sectional view of a pixel area of the circuit array substrate. FIGS. 3 and 4 are a sectional view of a connecting edge section of the LCD device and a plan view of its sectional layout, respectively.

The LCD device comprises display cell unit 30, driver circuit unit 40, TCP 100 and area light source 60. The LCD device is divided into pixel section 80 and connecting edge section 90. Display cell unit 30 includes circuit array substrate 10, counter substrate 20, a liquid crystal layer and a sealant to fix circuit array substrate 10 and counter substrate 20. TCP 100 electrically connects driver circuit unit 40 to display cell unit 30. Area light source 60 illuminates pixel section 80 of display cell unit 30.

As shown in FIG. 2, circuit array substrate 10 includes transparent insulation substrate 18 made of a glass plate, etc., scanning lines formed on transparent insulation substrate 18, switching elements 9, pixel electrodes 6 and auxiliary capacitors Cs. The scanning lines are disposed to cross signal lines 31 and are isolated from signal lines 31 by gate insulation film 15. Switching elements 9 are made of thin film transistors, for instance, provided at vicinities of the cross points of the scanning lines and signal lines 31. Switching elements 9 each have gate, drain and source electrodes 11a, 32 and 33 connected to the scanning lines, signal lines 31 and pixel electrodes 6, respectively. An inverted-staggered type thin film transistor will be explained as one example of the switching element 9 but other types of thin film transistors, such as a coplanar type TFT transistor, can be also used.

Thin film transistors 9 each are provided with gate electrodes 11a, gate insulation films 15, amorphous silicon (a-Si:H) layers 22, phosphor doped amorphous silicon (n+a-Si:H) layers 23, channel protection films 21, drain electrodes 31 and source electrodes 33.

Gate electrodes 11a of switching elements 9 are made of extending portions of the scanning lines and drain electrodes 32 of thin film transistors 9 are integrated with signal lines 31. Source electrodes 33 of switching elements 9 are electrically connected to the pixel electrodes through contact holes 43 and 53 perforated in interlayer insulation film 4 and thick resin film 5.

Pixel electrode 6 is provided at, and approximately covers, each element (pixel dot) of a matrix defined by the scanning lines and signal lines 31. Each pixel electrode 6 has a reflective pixel electrode 73 made of a metal film and a transparent pixel electrode 63 made of an indium-tin-oxide (ITO) film. Transparent pixel electrode 63 is disposed at a window-like aperture of reflective pixel electrode 73 surrounded by, and electrically connected to, outer edge portions of transparent pixel electrode 63. Transparent thick resin film 5 is provided with uneven portions 56 on its surface corresponding to reflective pixel electrode 73.

Wider line portion 13a for an auxiliary capacitor line and auxiliary capacitor electrode 35 extending from source electrode 33 are overlapped to form auxiliary capacitor Cs in the center of the pixel dot covered with reflective pixel electrode 73. Signal lines 31 are disposed extending to connecting edge section 90 and connected to TCP 100 through connecting pads 14.

As shown in FIGS. 3 and 4, connecting pads 14 are provided at naked section 54 of transparent thick resin film 5 in connecting edge section 90. Connecting pads 14 are formed at the same time as the scanning lines and are exposed at naked section 44 where gate and interlayer insulation films 15 and 4 are eliminated. Connecting pad 14 is connected to edge portion 31a of signal line 31 through connecting line 14a, contact holes 51, 41, 52 and 42, and bridge-like metal film 71 covering them. At the portion where connecting line 14a is connected to bridge-like metal film 71, lower contact hole 41 perforated through interlayer and gate insulation films 4 and 15 is provided at the bottom of upper contact hole 51 perforated through thick resin film 5. At the portion where signal line 31 is connected to bridge-like metal film 71, lower contact hole 42 perforated through interlayer insulation film 4 is provided at the bottom of upper contact hole 52 perforated through thick resin film 5.

Thick resin film 5 is more than 1 μm in thickness, for example, and is made of a low dielectric constant insulation resin such as acrylic photosensitive organic resin. Transparent thick resin film 5 covers entirely the circuit array substrate except naked section 54 to expose connecting pad 14 and upper contact holes 51, 52 and 53. As shown in FIG. 3, shoulder portion 55 is provided at edge face 5a of thick resin film 5 adjacent to naked section 54 at an end portion of connecting pads 14. A flat portion of shoulder portion 55 is preferably 5 µm to 20 µm in width but is set to be 10 µm in width, for instance. In short, a step for shoulder portion 55 is formed at edge face 5a of thick resin film 5 on the side of naked section 54 provided for TCP 100.

Assemblage of TCP 100 and circuit array substrate 10 is shown in the right end of FIG. 3. Main substrate 102 of TCP 100 is placed on thick resin film 5 along connecting edge section 90 of circuit array substrate 10. Terminal pin 101 is projected from main substrate 102 of TCP 100 to the inside of circuit array substrates 10. Contact portion 103 is thicker at the edge of terminal pin 101, extends downward and has a contact surface at its end. When TCP 100 is coupled with circuit array substrate 10, contact portion 103 placed in naked section 44 is pressed to connecting pad 14 by spring force of terminal pin 101. As shown in FIG. 3, terminal pin 101 contacts edge face 5a of thick resin film 5 at its middle point between main substrate 102 and contact portion 103.

FIG. 4 schematically shows a layout of sectional views of connecting edge section 90 of circuit array substrate 10. Projecting portions 5b of thick resin film 5 extending to pixel section 80 of circuit array substrate 10 are rectangular in shape and are disposed regularly in equal pitch 5c. Extending sizes and widths of rectangular projecting portions 5b are equal to each other and their pitches are substantially the same as those of connecting pads 14 and terminal pins 101. Each projecting portion 5b shown in FIG. 4 is provided at the place corresponding to each connecting pad 14. Projecting portion 5b is slightly wider in width than connecting pad 14. For instance, projecting portions 5b each are 180 µm in width, 370 µm in length and 460 µm in pitch. Connecting pad 14 is 150 µm in width. Since the inner edge pattern of transparent thick resin film 5 forms rectangular projecting portions in shape, it certainly prevents adjacent terminal pins 101 from causing electric short circuits as explained below.

Although terminal pins 101 are formed on projecting portions 5b in the above embodiment, terminal pins 101 can be disposed between adjacent projecting portions 5b to obtain substantially the same effect as the above embodiment.

Figure 5A:
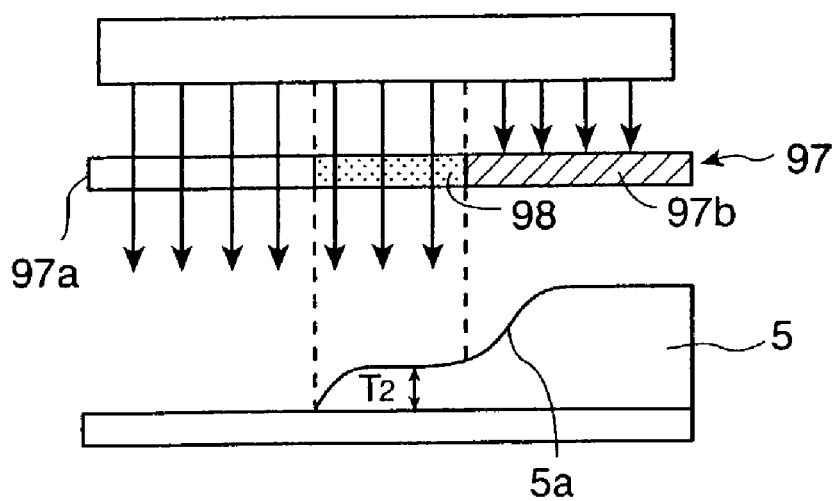
FIGS. 5A–5E are schematically fragmentary sectional views of components to explain a method of manufacturing a circuit array substrate in accordance with the present invention.

Now, a method of manufacturing the circuit array substrate will be explained below with reference to the attached drawings. Manufacturing steps of shoulder portion 55 of thick resin film 5 are schematically shown in FIGS. 5A–5E and an exposure treatment of shoulder portion 55 and uneven portions 56 is shown in FIGS. 6A and 6B.

(1) First Patterning

A 230 nm thick molybdenum-wolfram (MoW) film is formed on transparent insulation substrate 18 by applying a sputtering method. 176 scanning lines and gate electrodes 11a extending from the scanning lines per diagonal 2.2-inch (56 mm) long rectangle and each wider line portion 13a for auxiliary electric capacitor line 13 per pixel dot are formed by using a first photomask pattern. At the same time connecting pad 14 and its connecting line 14a are formed at connecting edge section 90.

(2) Second Patterning

A 350 nm thick silicon oxide and silicon nitride (SiO/SiNx) film is deposited to form gate insulation film 15. A 50 nm thick amorphous silicon (a-Si:H) layer 22 for switching element 9, which is a thin film transistor, and a 200 nm nitride silicon (SiNx) layer for channel protection film 21 are successively formed without exposing the same to air. After a photoresist film is coated on them, channel protection film 21 is formed over each gate electrode 11a in accordance with a rear exposure technique applied to the photoresist film by using the pattern of the scanning lines, etc. made in the first patterning as a photomask.

(3) Third Patterning

In order to obtain good ohmic contact, an exposed surface of the amorphous silicon (a-Si:H) layer is processed with hydrofluoric acid. A 50 nm thick phosphorous doped amorphous silicon (n+a-Si:H) is then deposited by applying the same chemical vapor deposition method as described above to make a low electric resistance semiconductor film 23. After that, three metal (Mo/Al/Mo) layers of a 25 nm thick bottom molybdenum (Mo) layer, a 250 nm thick aluminum (Al) layer and a 50 nm thick molybdenum (Mo) layer are formed by using a sputtering method.

After the photoresist film is then treated with exposure by using a third photomask pattern and development, the amorphous silicon (a-Si:H) layer, phosphorous doped amorphous silicon (n+a-Si:H) layer and three metal (Mo/Al/Mo) layers are collectively subjected to this third patterning. Such patterning makes 220×3 signal lines 31 per diagonal 2.2-inch (56 mm) long rectangle region, drain electrodes extending from signal lines 31 and source electrode 33. At the same time auxilary capacitor electrodes 35 for auxiliary electric capacitors Cs are formed to approximately overlap wider line portions 13a of auxiliary electric capacitor lines 13.

(4) Fourth Patterning

The multi-layer pattern formed above is covered with interlayer insulation film 4 made of a 50 nm thick nitride silicon (SiNx) film. Interlayer and gate insulation films 4 and 15 are then perforated to form lower contact holes 41, 42 and 43 and naked section 44.

(5) Fifth Patterning

Subsequently, a positive photo-setting solution made of acrylic resin is uniformly coated to form a 2 µm thick film after drying up. Circuit array substrate 10 is then subjected to exposure, development, ultraviolet irradiation, post baking and washing treatments.

The ultraviolet irradiation reduces non-reacting components in the thick resin film 5 to improve its transparency. As shown in FIGS. 5A, 6A and 6B, a strong exposure is applied to form upper contact holes 51, 52 and 53 and naked sections 54 for connecting pads 14 but a weak exposure is used to form shoulder portions 55 and uneven portions 56.

As shown in FIG. 6A, photomask 97 prepared for this exposure treatment is provided with transparent portion 97a and light blocking portion 97b and mesh-patterned, semi-transparent portions 98 and 98a. In other words, a half-tone patterning method is employed for the exposure treatment. Transparent and light blocking portions 97a and 97b correspond to the portions where thick resin film 5 is removed to form upper contact hole 53 and naked portion 54, respectively. Semi-transparent portions 98 and 98a correspond to portion for shoulder portion 55 and uneven portions 56, respectively. Semi-transparent portion 98 is larger in transparency than the one 98a so that shoulder portion 55 is different in depth from uneven portions 56. In short, as shown in FIG. 6B, mesh-patterned density of portions of photomask 97 controls their transparency and also depths of uneven portions 56 made in thick resin film 5. Thus, half-tone patterning photomask 97 requires only a one-time operation for positioning of photomask 97 or the like. Semi-transparent portions 98 and 98a of photomask 97 can be made of pigments, dyes or other materials than the metal meshes. Further, the thickness of shoulder portion 55 is preferably set to be one half of that of thick resin film 5 to avoid the remnant of an etching treatment as will be explained later.

Uneven portions 56 provided in reflective pixel electrode 73 are preferably about 0.5 μm in depth to provide reflective pixel electrode 73 with a light scattering function. With such a depth of uneven portions 56, optimal uneven patterns are formed in order for reflective pixel electrode 73 to scatter incident light.

Transparent thick resin film 5 makes the liquid crystal layer substantially uniform in thickness when assembled into an LCD device. Since the pixel electrodes are overlapped with the signal lines, etc. through thick resin film 5, it also performs to extend the formation area of pixel electrodes and improve light utilization efficiency of the LCD device.

Transparent thick resin film 5 may be made of a negative photosensitive material instead of the positive one described above. In such a case, portions subjected to no exposure treatment are changed to those subjected to strong exposure treatment, but those subject to weak exposure treatment remain unchanged.

(6) Sixth Patterning

After a 40 nm ITO film is formed, a photoresist film is coated entirely on circuit array substrate 10 and exposure and development treatments are carried out. Under this photoresist pattern, a patterning process is performed by using an oxalate aqueous solution as an etching solution to form transparent pixel electrode 63.

(7) Seventh Patterning (FIGS. 5A–5D)

Figure 5B:
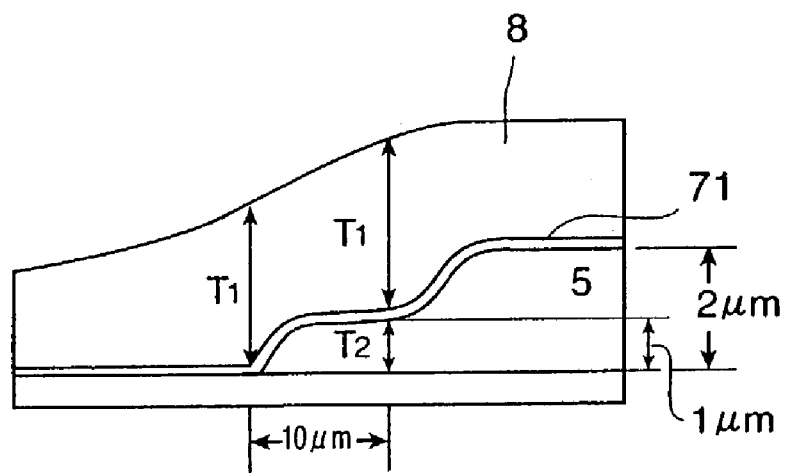
Figure 6A:
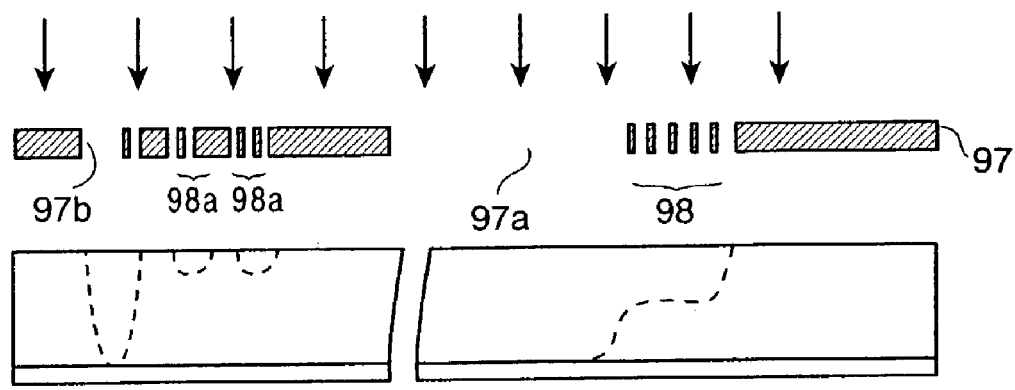
FIGS. 6A and 6B are schematically sectional views of components to explain the processing steps shown in FIGS. 5A–5E.
Figure 6B:
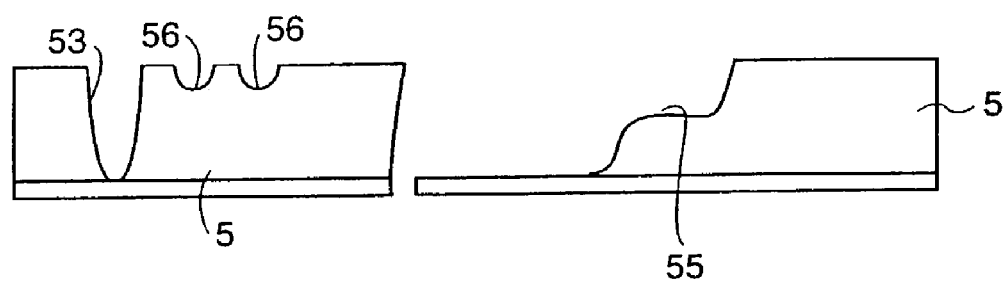

As shown in FIG. 5B, bridge-like electrically conductive double layered metal film 71 made of a 50 nm thick molybdenum (Mo) film and a 50 nm thick aluminum (Al) film is formed on thick resin film 5 by applying a sputtering method. A positive photoresist film 8 is then coated on bridge-like electrically conductive double layered film 71, and exposure treatment by a photomask and development are, subsequently, carried out to make a predetermined photoresist pattern.

Figure 5C:
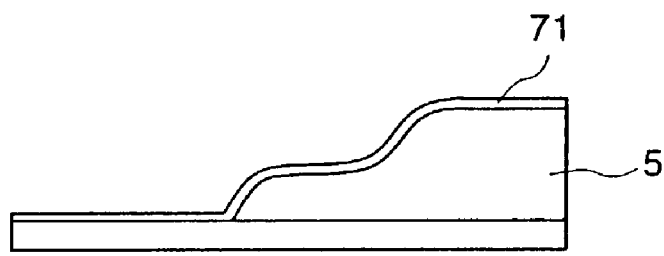

The thickness of positive photoresist film 8 is not excessive at the portion where shoulder portion 55 is formed in edge face 5a of thick resin film 5, so that a sufficient exposure treatment is carried out for it, i.e., such an exposure treatment is well performed at the foot of edge face 5a. Thus, as shown in FIG. 5C, no photoresist is left at the foot of edge face 5a after development.

Even if a treatment error makes positive photoresist film 8 excessively thick and metal film 71 remains partially at the foot of edge face 5a after etching, adjacent terminal pins 101 will be prevented from electric short circuits. In other words, as shown in FIG. 4, since projecting portions 5b of thick resin film 5 are rectangles or wave-shapes in plan view, the strip metal is not left over adjacent terminal pins 101.

Figure 5D:
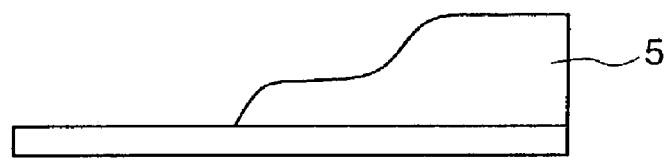

Under this photoresist pattern, wet etching implements patterning of the double layered metal (Mo/Al) film to form metal film 71 and reflective pixel electrode 73. In this case, as shown in FIG. 5D, if the wet etching is carried out by using a photoresist pattern that leaves little or no photoresist, no metal film remains at the foot of edge face 5a of thick resin film 5 (where interlayer insulation film 4 meets thick resin film 5).

Reflective pixel electrode 73 is overlapped with transparent pixel electrode 63 at its edge portion in each pixel dot to electrically connect the same to transparent pixel electrode 63. Reflective pixel electrode 73 covers thin film transistor 9 and contact holes 53 and 43 to connect directly source electrode 33. Reflective pixel electrode 73 is overlapped with signal line 31 through thick resin film 5. Circuit array substrate 10 is completed in this way.

Figure 5E:
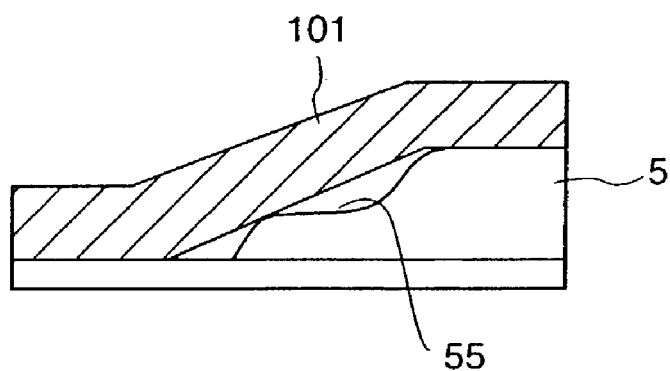

Counter substrate 20 provided opposite to circuit array substrate 10 is made by the following steps: (1) formation of a light shielding pattern (black matrix), (2) formation of red (R), blue (B) and green (G) color filter layers on each pixel dot, (3) formation of column-like spacers and (4) formation of a counter electrode made of an ITO film. A sealant is applied to edges of circuit array substrate 10 and/or counter substrate 20 to incorporate them into display cells. After that, they are cut out to make display cells, the liquid crystal is injected from an inlet into each display cell, the inlet is closed with a sealant and a display panel (LCD device) is completed. The connecting edge of the LCD device, i.e., connecting edge section 90 of circuit array substrate 10, is connected to TCP 100 as shown in FIG. 5E. In this case, no metal film remains along edge face 5a of thick resin film 5.

As set forth above, this invention is applied to a circuit array substrate used for a display device. The circuit array substrate has a pixel section and a connecting edge section to which connecting pins connect outer drive circuits. The pixel section includes switching elements, a thick resin film coating the switching elements and pixel electrodes formed on the thick resin film. The connecting edge section includes also a thick resin film formed on the circuit array substrate and a naked portion where the thick resin film is removed. A shoulder portion is formed on the edge portion of the thick resin film in the connecting edge section to prevent outer connecting pins from making electric short circuits.

The shoulder portions of the thick resin film each are provided with rectangular projecting portions and each projecting portion or a space portion between neighbor projecting portions is assigned to one of the outer connecting pins to prevent the same from making electric short circuits. Further, a photomask and an exposure light source are used commonly to form both shoulder portions and uneven patterns in the thick resin film which are mutually different in depth and in pattern from each other.

Figure 7A:
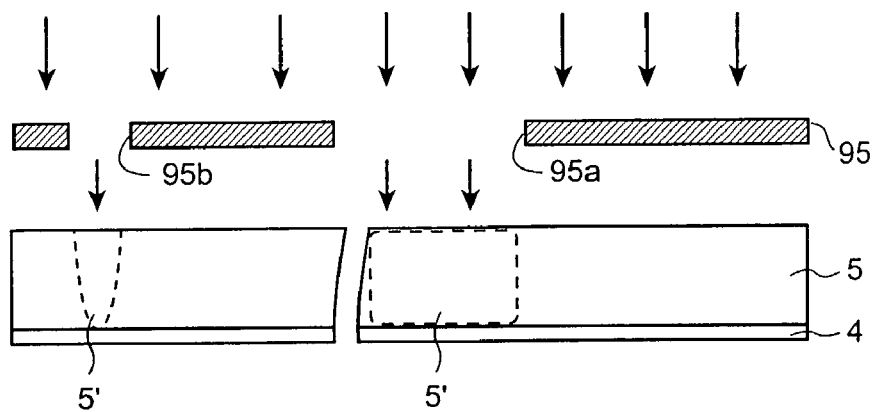
FIGS. 7A–7C are schematically sectional views of components to explain a method of manufacturing a circuit array substrate in accordance with the present invention.
Figure 7B:
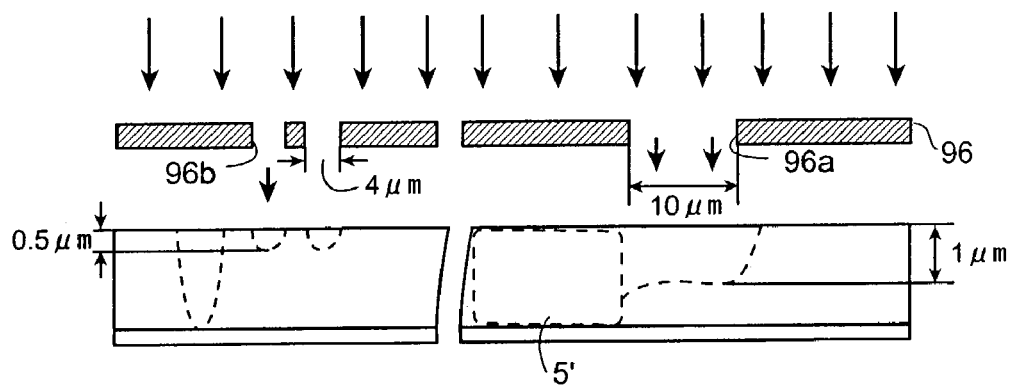

The fifth patterning is not limited to the one described above. For example, as shown in FIGS. 7A and 7B, two photomasks 95 and 96 are prepared and used at strong and weak exposure treatments, respectively. Such strong and weak exposure treatments depend upon accumulated quantity of effective exposure light controlled by exposure intensity and time.

Photomask 95 prepared for the strong exposure treatment includes transparent portions 95a and 95b corresponding to naked section 54 and upper contact hole 53, respectively. After the strong exposure treatment, thick resin film 5 melts from its upper surface to interlayer insulation film 4 to form melting portions 5' underneath transparent portions 95a and 95b as shown in FIG. 7A.

The weak exposure treatment is then performed with photomask 96 as shown in FIG. 7B. Photomask 96 is provided with transparent portions 96a and 96b corresponding to shoulder portion 55 and uneven portions 56, respectively. After the weak exposure treatment, thick resin film 5 melts from its upper surface to different depths to form melting portions 5' underneath transparent portions 96a and 96b as shown in FIG. 7B.

Figure 7C:
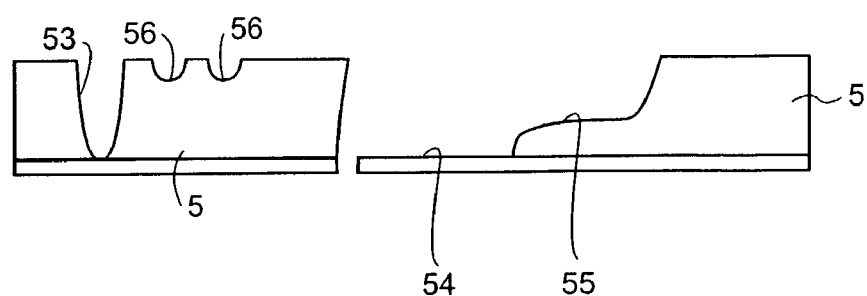
Figure 8A:
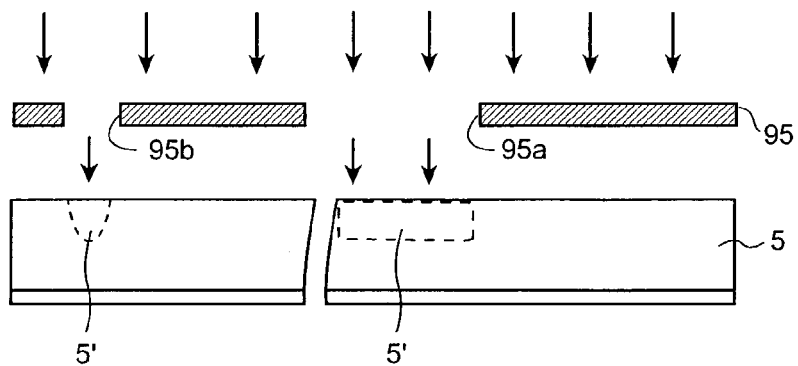
FIGS. 8A–8D are schematically sectional views of components to explain a method of manufacturing a circuit array substrate in accordance with the present invention.
Figure 8B:
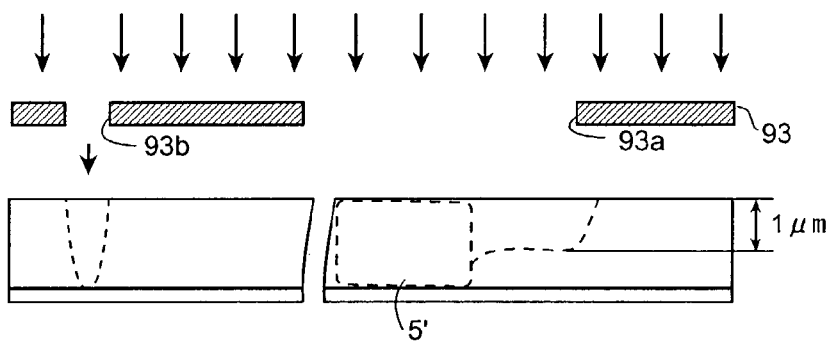
Figure 8C:
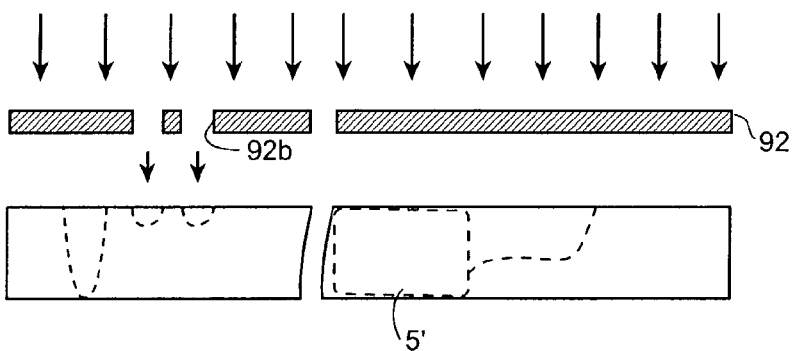
Figure 8D:
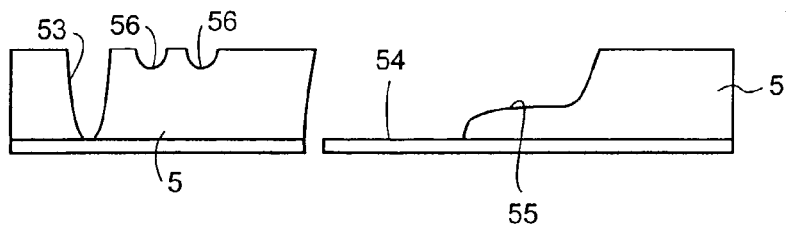

As size data, for example, transparent portions 96a and 96b are provided with a 10 μm width slit and a plurality of 4 μm rectangular perforations, respectively. Ultraviolet light passing through the 10 μm width slit of transparent portion 96a is not affected with light interference but the one passing through the 4 μm rectangular perforations of transparent portion 96b become weak due to optical interference. Thus, the melting depth of thick resin film 5 is 1 μm underneath the 10 μm width slit of transparent portion 96a but it is only about 0.5 μm under the 4 μm rectangular perforations of transparent portion 96b. After a development treatment is carried out to remove melting portions 5' from thick resin film 5, uneven portions 56 and shoulder portion 55 become about 0.5 μm and 1 μm in depth from the upper surface of thick resin film 5 as shown in FIG. 7C, respectively.

The thickness of thick resin film 5, i.e., that of portion subjected to no exposure, is 2 μm but that T1 of shoulder portion 55 is 1 μm. As already set forth with reference to FIG. 4, the flat portion of shoulder portion 55 is 10 μm in length as a concrete example. In this way where an exposure depth is controlled by a same photomask, a slit is more than twice the width of an aperture.

Another embodiment is schematically shown in FIGS. 8A–D. In this embodiment, a weak exposure treatment is repeated to accumulate sufficient exposure quantity which is necessary to remove portions for naked section 54 and upper contact holes 51, 52 and 53 from thick resin film 5.

The first exposure treatment is implemented by using first photomask 95 provided with transparent portion 95a corresponding to naked section 54 and transparent portion 95b corresponding to upper contact holes 51, 52 and 53 perforated in thick resin film 5. This photomask is the same in pattern as the one used for the one shown in FIG. 7A. The first weak exposure treatment makes thick resin film 5 under transparent portions 95a and 95b melt substantially up to a depth half that of its upper portions.

A second photomask 93 used for the second weak exposure treatment is provided with transparent portions 93a and 93b corresponding to shoulder portion 55 and naked section 54, and upper contact holes 51, 52 and 53, respectively. The second weak exposure treatment allows thick resin film 5 at naked section 54 and upper contact holes 51, 52 and 53 to melt from its surface down to the level of the upper surface of interlayer insulation film 4. The second exposure treatment also causes thick resin film 5 at shoulder portion 55 to melt in a depth of about 1 μm.

A third photomask 92 used for the third weak exposure treatment is provided with only transparent portions 92b corresponding to uneven portions 56 of reflective pixel electrode 73. The third exposure is weaker in intensity than the first and second ones. The third weak exposure treatment makes thick resin film 5 at uneven portions 56 melt in a depth of about 0.5 μm. Since melted portions 5' are removed from thick resin film 5 by development, the circuit array substrate thus obtained is the same in structure as the first embodiment.

In the embodiments described above, reflective pixel electrode 73 is provided with uneven portions 56 but it may be a flat electrode as transparent pixel electrode 63. Further, thick resin film 5 corresponding to the portion of transparent pixel electrode 63 can be removed and transparent pixel electrode 63 may be formed on interlayer insulation film 4.

The embodiments described above are directed to a transflective type display device in which each pixel dot includes reflective pixel electrode 73 and transparent pixel electrode 63 but the present invention is applicable to not only such display device but also a partial reflection type display device in which reflective and transparent pixel electrodes are partially provided, a reflection type display device, a transparent type display device, etc.

Figure 9:
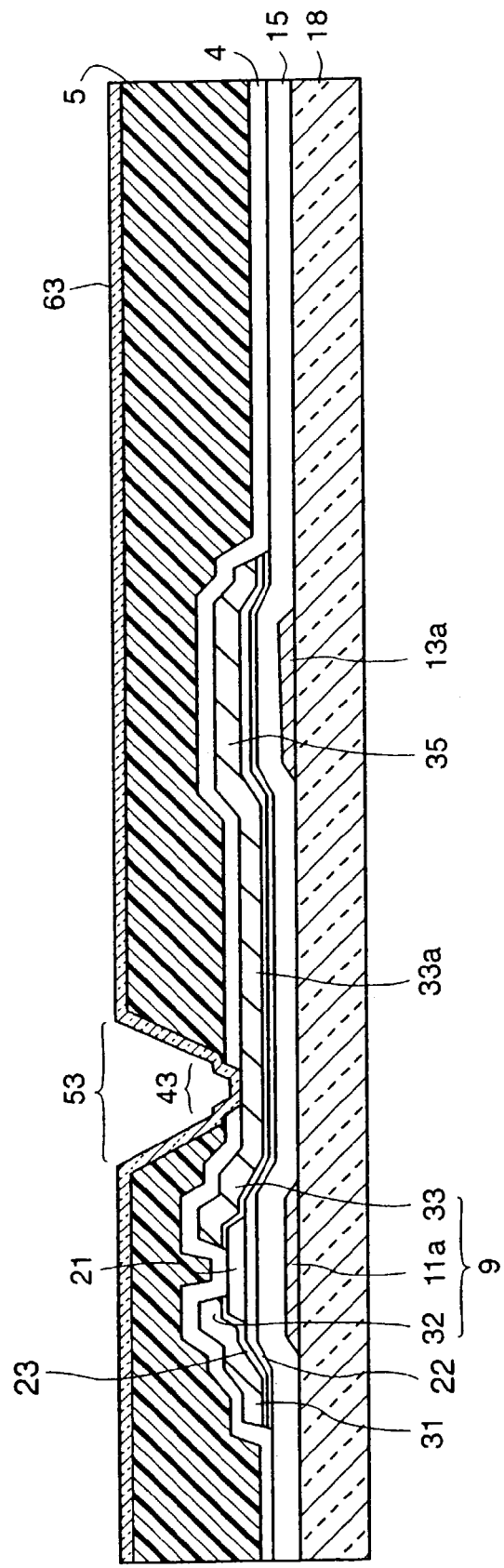
FIG. 9 is a sectional view of a transparent type display device of the present invention.

As one of such display devices, FIG. 9 shows a sectional view of a circuit array substrate used for a transparent type display device. Transparent pixel electrode 63 directly contacts, and is electrically connected to, an upper surface of portion 33a extending from source electrode 33 through contact holes 43 and 53. In a contacting edge section, not shown, a bridge-like electrically conductive film made of a metal film for contact can be substituted for the one made of an ITO film. In short, transparent pixel electrode 63 and the bridge-like electrically conductive film 71 are made of the same material, such as an ITO film, and at the same time.

COMPARISON EXAMPLE

A comparison example will be explained with reference to FIGS. 10A–10E. A method of manufacturing a comparison example circuit array substrate is the same as the embodiments described above except that it does not form shoulder portion 55 at edge face 5a of thick resin film 5. As will be explained below, an etching treatment leaves residues 75 of bridge-like electrically conductive double layered metal (Mo/Al) films 71 along the foot of edge face 5a that contact terminal pins 101 at their middle points between contact portion 103 and TCP 100 as shown in FIG. 10E. Thus, such residues 75 of metal films 71 cause electric short circuits between adjacent terminal pins 101.

Figure 10A:
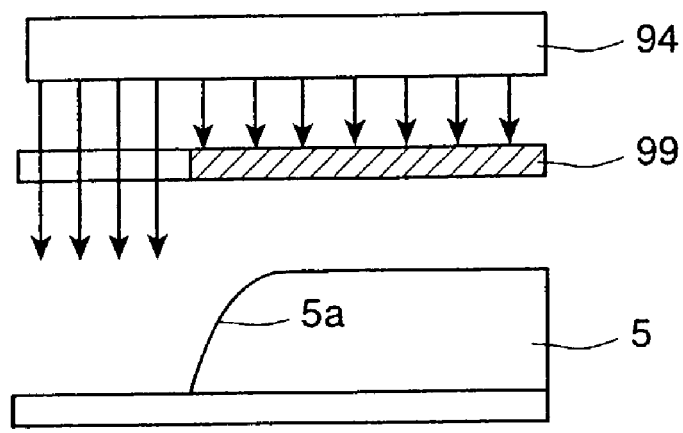
FIGS. 10A–10E are schematically sectional views of components to explain a method of manufacturing a circuit array substrate for comparison with those shown in FIGS. 5A–5E.

As shown in FIG. 10A, since strong ultraviolet beams are irradiated from exposure light source 94 to transparent thick resin film 5 in the contacting edge section through transparent and light blocking patterned photomask 99, there are two distinctive areas in thick resin film 5 which are subjected to strong and no exposure treatments, respectively. Edge face 5a of thick resin film 5 becomes relatively steep or simply curved in cross section.

Figure 10B:
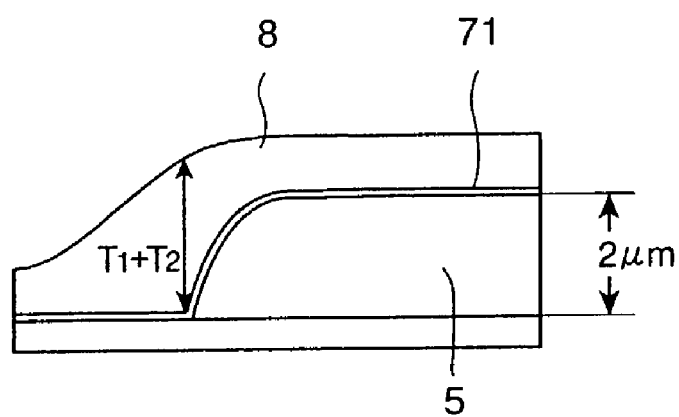
Figure 10C:
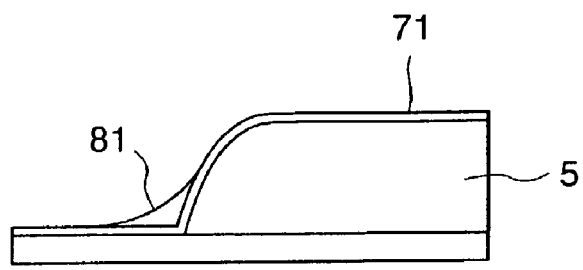

When positive photoresist film 8 is coated on the bridge-like electrically conductive double layered (Mo/Al) metal film 71, positive photoresist film 8 at edge face 5a of thick resin film 5 is remarkably thicker than other portions as shown in FIG. 10B. Its thickness T=T1+T2 where T1 and T2 are photoresist thicknesses at ordinary portions and that corresponding to the height of shoulder portion 55 shown in the first embodiment (see FIG. 5B), respectively. Thus, the exposure light does not well reach the bottom at the foot of edge face 5a of thick resin film 5, which is not sufficiently melted. As a result, there are residues 81 of positive photoresist film 8 after development as shown in FIG. 10C.

Figure 10D:
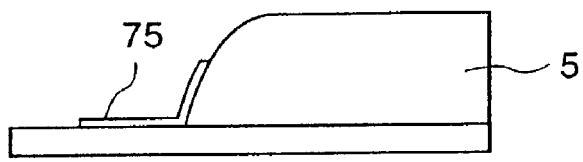
Figure 10E:
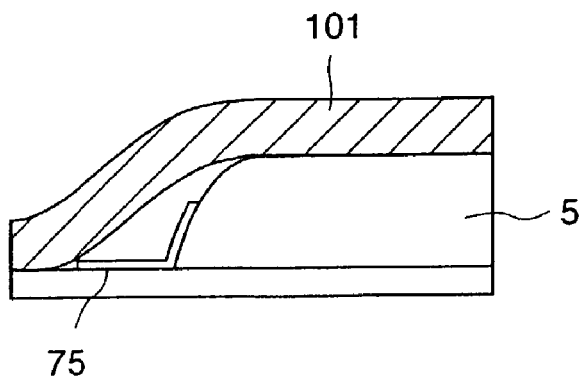

After treatments of etching and removal of photoresist patterns with the connecting edge section, residues 81 of positive photoresist film 8 cause etching residues 75 of metal film 71 as shown in FIG. 10D. When TCP 100 is connected to the connecting edge section, electric short circuits are often made between adjacent terminal pins 101 through the residues 75 of metal film 71 as shown in FIG. 10E.

As described above in detail, the circuit array substrate of the present invention effectively prevents adjacent terminal pins from causing such electric short circuits.

This present invention may be practiced or embodied in still other ways without departing from the spirit or essential character of the invention.

Although the amorphous silicon (a-Si) thin film transistor type circuit array substrates are explained above, the present invention is further applicable to polycrystalline silicon (p-Si) type circuit array substrates. In this case, formation and patterning of thin film transistors can be implemented by prior art methods disclosed in Japanese Patent Publication No. 2000-330484 or 2001-339070.

Further, the terminal pins of the TCP connect the outer drive circuits to the circuit array substrate in the above embodiments but other components, such as anisotropic conductive films, can also be substituted for the terminal pins. Likewise, the TCP may be a polyimide flexible plastic substrate on which printed circuits and IC chips are provided.

In addition, this invention can be practiced not only to LCD devices but also to other display devices, such as organic electro-luminescence (EL) display devices.

According to the present invention, connecting pads or terminal pins connected to the pads in a circuit array substrate are sufficiently prevented from causing electric short circuits.

What is claimed is:

1. A circuit array substrate for a display device comprising:

an insulation substrate;

a wiring pattern formed over said insulation substrate;

connecting pads connected to said wiring pattern;

a more than 1 µm thick insulation film to coat said wiring pattern except said connecting pad which defines a naked portion; and electrically conductive pixel electrodes formed on said thick insulation film;

wherein said thick insulation film includes edge faces and shoulder portions provided close to said connecting pad.

2. The circuit array substrate for a display device according to claim 1, wherein said edge faces of said thick insulation film are provided with rectangular projections extending to said shoulder portions in a direction of said connecting pad and pitches of said rectangular projections are substantially the same as those of said connecting pads.

* * * * *